(12) United States Patent
Dinh (10) Patent No.: US 9,018,524 B2
(45) Date of Patent: Apr. 28, 2015

(54) BLADE-EDGE VAPOR-TIGHT ELECTRICAL BOX

(71) Applicant: Thomas & Betts International, Inc., Wilmington, DE (US)

(72) Inventor: Cong Thanh Dinh, Collierville, TN (US)

(73) Assignee: Thomas & Betts International, Inc., Wilmington, DE (US)

( * ) Notice: Subject to any disclaimer, the term of this patent is extended or adjusted under 35 U.S.C. 154(b) by 172 days.

(21) Appl. No.: 13/751,417

(22) Filed: Jan. 28, 2013

(65) Prior Publication Data

US 2013/0264088 A1 Oct. 10, 2013

Related U.S. Application Data

(60) Provisional application No. 61/622,036, filed on Apr. 10, 2012.

(51) Int. Cl.
*H05K 5/06* (2006.01)
*H02G 3/08* (2006.01)

(52) U.S. Cl.
CPC . *H05K 5/06* (2013.01); *H02G 3/088* (2013.01)

(58) Field of Classification Search
CPC ....................................................... H05K 5/06
USPC ..................................... 174/50.5, 50.54, 505
See application file for complete search history.

(56) References Cited

U.S. PATENT DOCUMENTS

| | | | | |
|---|---|---|---|---|
| 3,288,407 A * | 11/1966 | Piper et al. | | 248/56 |
| 3,684,819 A * | 8/1972 | Wilson | | 174/53 |
| 4,265,365 A * | 5/1981 | Boteler | | 220/3.3 |
| 4,389,535 A * | 6/1983 | Slater et al. | | 174/666 |
| 4,408,695 A * | 10/1983 | Balkwill et al. | | 220/3.3 |
| 4,673,097 A * | 6/1987 | Schuldt | | 220/3.5 |
| 4,724,281 A * | 2/1988 | Nix et al. | | 174/53 |
| 4,757,158 A * | 7/1988 | Lentz | | 174/53 |
| 4,794,207 A * | 12/1988 | Norberg et al. | | 174/505 |
| 4,952,754 A * | 8/1990 | Rye | | 174/53 |
| 5,287,665 A * | 2/1994 | Rath, Jr. | | 52/220.8 |
| 5,600,093 A * | 2/1997 | Herth et al. | | 174/53 |
| 6,239,365 B1 * | 5/2001 | McEvers | | 174/50 |
| 6,395,984 B1 | 5/2002 | Gilleran | | |
| 6,596,938 B2 * | 7/2003 | Gilleran | | 174/58 |
| 6,927,338 B2 * | 8/2005 | Shimola et al. | | 174/668 |
| 6,956,168 B2 * | 10/2005 | Herth | | 174/53 |
| 6,956,169 B1 * | 10/2005 | Shotey et al. | | 174/58 |
| 6,956,171 B1 * | 10/2005 | Gretz | | 174/58 |
| 7,049,515 B1 * | 5/2006 | Collins et al. | | 174/668 |
| 7,126,058 B2 * | 10/2006 | Herth | | 174/58 |
| 7,259,327 B1 * | 8/2007 | Herth | | 174/50 |
| 7,307,212 B1 * | 12/2007 | Gretz | | 174/53 |

* cited by examiner

*Primary Examiner* — Timothy Thompson
*Assistant Examiner* — Michael F McAllister
(74) *Attorney, Agent, or Firm* — Snyder, Clark, Lesch & Chung, LLP (57) ABSTRACT

An electrical box includes one or more sides joined to form a front opening to receive an electrical device. The electrical box also includes a flange extending laterally from the one or more sides. The flange includes a blade edge configured to have an initial engagement with a surface of a wallboard when the electrical box is installed in an opening of the wallboard. When the electrical box is installed in the opening of the wallboard, the blade edge forms a vapor-tight barrier between the electrical box and the surface of the wallboard.

20 Claims, 8 Drawing Sheets

BLADE-EDGE VAPOR-TIGHT ELECTRICAL BOX

CROSS-REFERENCE TO RELATED APPLICATION

This application claims priority under 35 U.S.C. §119, based on U.S. Provisional Patent Application No. 61/622,036, filed Apr. 10, 2012, the disclosure of which is hereby incorporated by reference herein.

BACKGROUND INFORMATION

Electrical boxes are included in buildings positioned where, for example, an outlet or a switch is required. Cables of an electrical circuit generally lead into the electrical box and are attached to a switch or outlet in the electrical box. In new construction, electrical boxes are typically secured to studs/rafters before a wall surface is installed. For some existing construction, electrical boxes may be inserted through holes in existing wallboard installations.

Vapor-tight electrical boxes are designed to meet energy-efficiency requirements for modern homes. Conventional vapor-tight electrical boxes include a flange covered with a foam gasket. The foam gasket provides a vapor-tight seal between the electrical box and a wall surface. Use of the foam gaskets, along with additional gaskets over cable entry points, may combine to prevent the free flow of air through the electrical box. The use of such vapor-tight boxes helps control heating and cooling costs.

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

According to implementations described herein, an electrical box is provided with a flexible flange and blade edge. The flange may be compressed against a wall surface (or another flat surface) to form a vapor-tight seal between the flange and the wall surface without using a separate gasket.

As used herein, the term "vapor-tight seal" is a seal that prevents the free flow of air through the seal. In descriptions herein, a "front surface" or a "front edge" may generally refer to a surface/edge of an electrical box or a wall that faces towards a room's interior when installed. Conversely, a "rear surface" may generally refer to a wall surface or electrical box surface that faces towards a room's exterior when installed.

Figure 1:
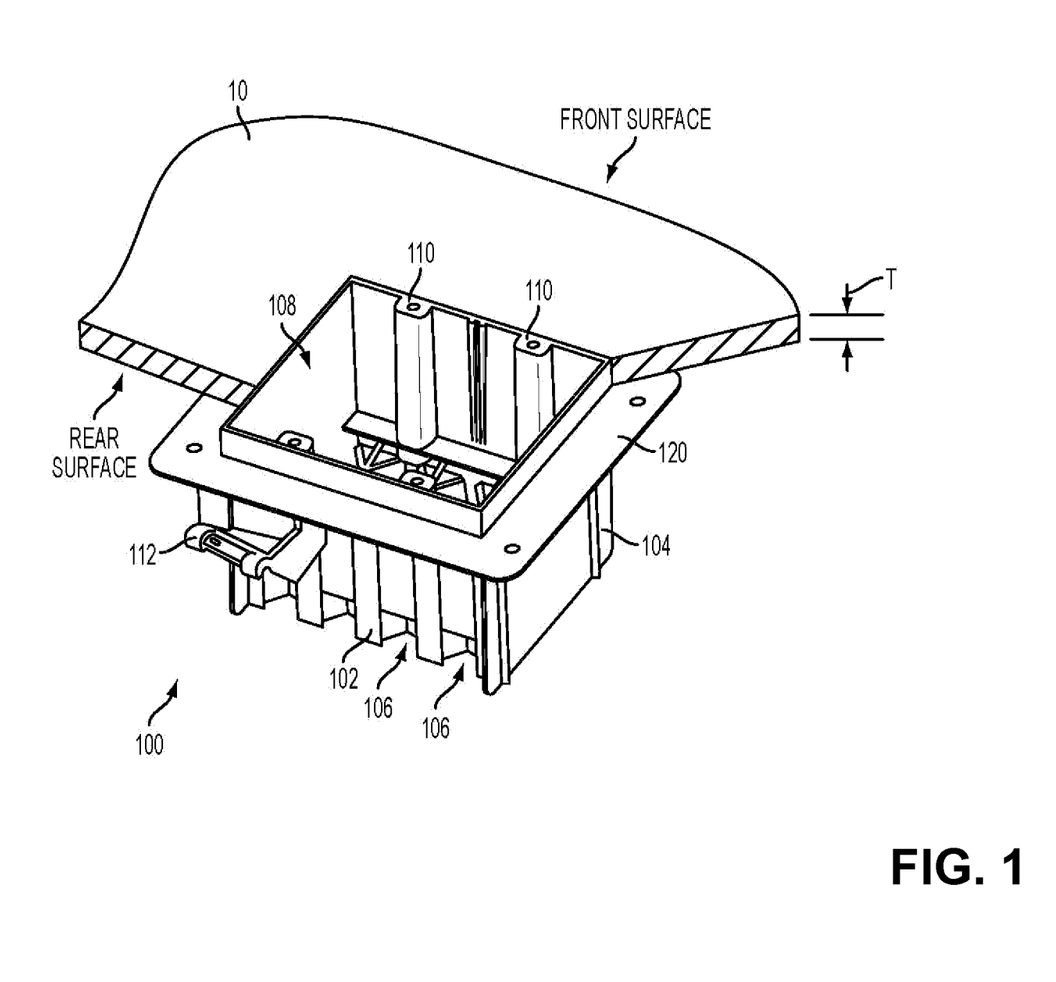
FIG. 1 provides an isometric view of an electrical box for new construction according to an implementation described herein.

FIG. 1 provides an isometric view of an electrical box 100 for new construction according to an implementation described herein. Electrical box 100 may generally include multiple sides, such as side walls 102 and end walls 104. Walls 102 and 104 may join a back plate (not visible) with one or more openings 106 (e.g., so that cables may be led into electrical box 100). Walls 102 and 104 may form a front opening 108 (e.g., to receive a switch, outlet, or another electrical device) opposite the back plate. Lugs 110 may be included on walls 102 and/or 104 at front opening 108. Lugs 110 may include threaded openings configured to align with holes of an electrical device such that a screw may be used to secure the electrical device to electrical box 100. As shown in FIG. 1, electrical box 100 is a "double gang" configuration, where two standard electrical devices may be installed within electrical box 100. However, implementations described herein may be applicable to other electrical box sizes (e.g., single gang, triple gang, etc.). Electrical box 100 may also include a configuration to secure electrical box 100 in position in a building. For example, electrical box 100 may include one or more integrally molded channels 112 to receive a nail, a screw, or some other type of fastener.

As described further herein, electrical box 100 may include a flange 120. Flange 120 may extend laterally from (e.g., essentially perpendicular to) walls 102 and 104 along a perimeter of electrical box 100. In the implementation of FIG. 1, flange 120 may be set back at a distance, T, from the edge of walls 102 and 104 that form front opening 108. The distance, T, may correspond to, for example, the thickness of a wallboard 10, such that the front face of electrical box 100 may extend flush with a front surface of wallboard 10 when flange 120 engages a rear surface of wallboard 10.

Electrical box 100 is generally applicable to new construction, where electrical box 100 is installed prior to wallboard 10. In one implementation, electrical box 100 may be made of a single, molded piece. For example, suitable materials for electrical box 100 may include polyvinyl chloride (PVC), polycarbonate, nylon 6-6, or another non-electrically-conductive material. In other implementations, electrical box 100 may be formed by joining together multiple separate pieces.

Figure 2A:
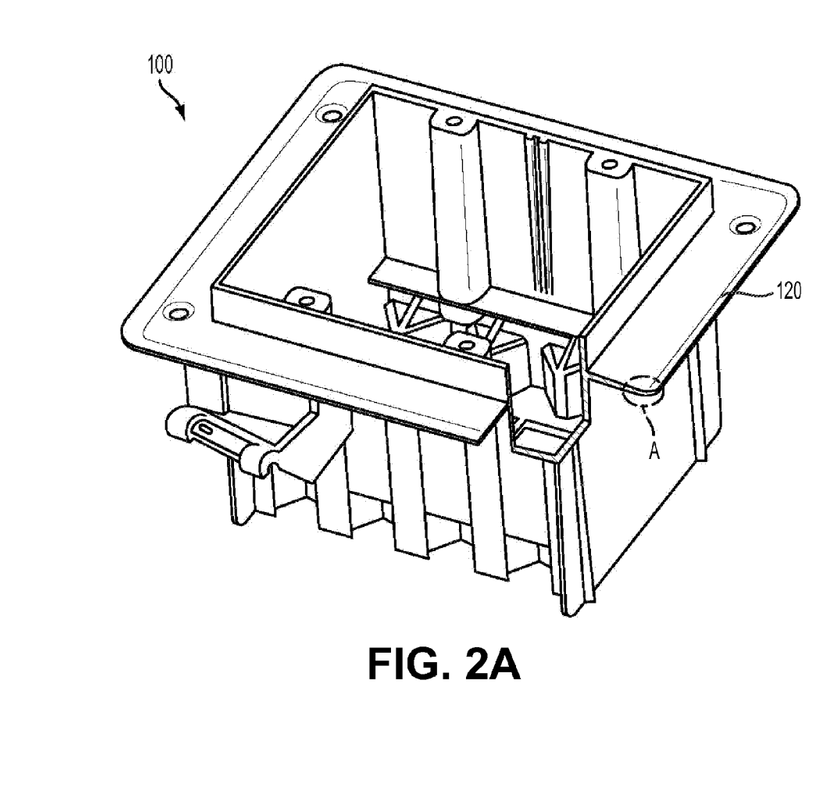
FIG. 2A provides a cutaway view of the electrical box of FIG. 1.
Figure 2B:
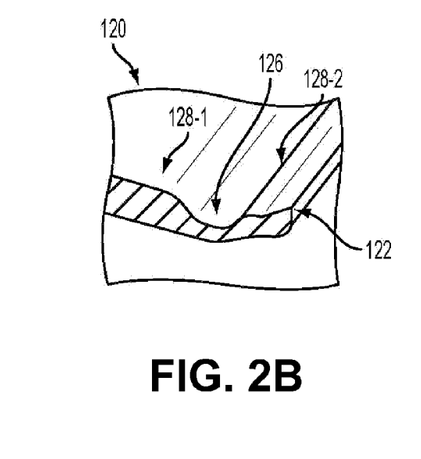
FIG. 2B provides an enlarged view of a portion of FIG. 2A.
Figure 3:
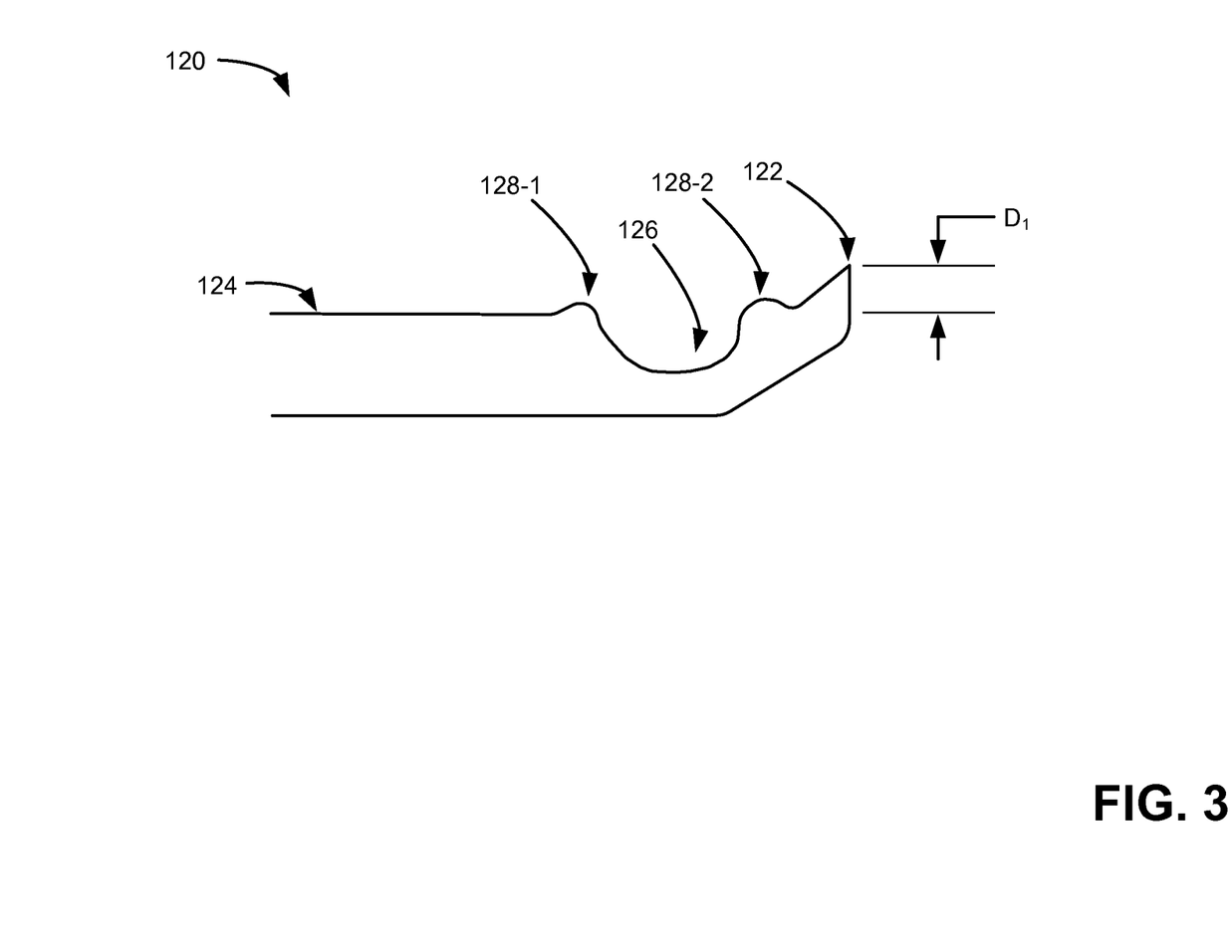
FIG. 3 is cross-section view of a flange of the electrical box of FIG. 1.

FIG. 2A provides a cutaway view of electrical box 100, and FIG. 2B provides an enlarged view of a cutaway portion, A, of FIG. 2A. FIG. 3 is cross-section view of flange 120 of electrical box 100. Referring collectively to FIGS. 1-3, flange 120 of electrical box 100 may be configured to engage a rear surface (e.g., of wallboard 10) with a thin outer edge 122 (also referred to herein as a "blade edge"). Outer edge 122 may extend at a distance, $D_1$, beyond a primary contact surface 124 of flange 120 such that outer edge 122 may have an initial engagement with the rear surface of wallboard 10 when electrical box 100 is installed in an opening of wallboard 10. Thus, outer edge 122 may contact and press into a rear surface of wallboard 10 when wallboard 10 is forced into place against electrical box 100 during installation. Pressing into a surface of wallboard 10 may include, for example, indenting, puncturing, penetrating, and/or otherwise deforming wallboard 10 such that outer edge 122 may engage wallboard 10 to form a vapor-tight seal.

Flange 120 may also include a channel 126 that extends around a portion of flange 120. Channel 126 may provide an area of reduced cross-section to permit flexing of outer edge 122 independently from the rest of flange 120. In one implementation, flange 120 may include one or more ridges 128-1 and 128-2 (referred to herein collectively as "ridges 128") next to channel 126. Ridges 128 may provide an increased cross-section to reinforce channel 120 near the area of flexing. Ridges 128 may also provide an additional contact surface against the rear surface of wallboard 10 when outer edge 122 has fully engaged (e.g., penetrated) the rear surface of wallboard 10.

In practice, electrical box 100 may be secured to a wall (e.g., a stud) during new construction using, for example, a nail driven through molded channels 112. Flange 120 may be aligned with a front surface of the stud. An opening in wallboard 10 may be cut so that the portion of walls 102 and 104 forming front opening 108 may extend through the corresponding opening in wallboard 10. The rear surface of wallboard 10 adjacent to the opening may generally engage flange 120. More particularly, flange 120 may extend substantially parallel to a plane defined by the surface of wallboard 10, and blade edge 122 may extend at an angle into the plane defined by the rear surface of wallboard 10. Wallboard 10 may push against outer edge 122 so that outer edge 122 cuts into the rear surface of wallboard 10 as wallboard 10 is eventually pushed into place against primary contact surface 124 of flange 120. The penetration of outer edge 122, along the entire circumference of flange 120, into the rear surface of wallboard 10 may form a vapor-tight seal between electrical box 100 and wallboard 10.

Figure 4A:
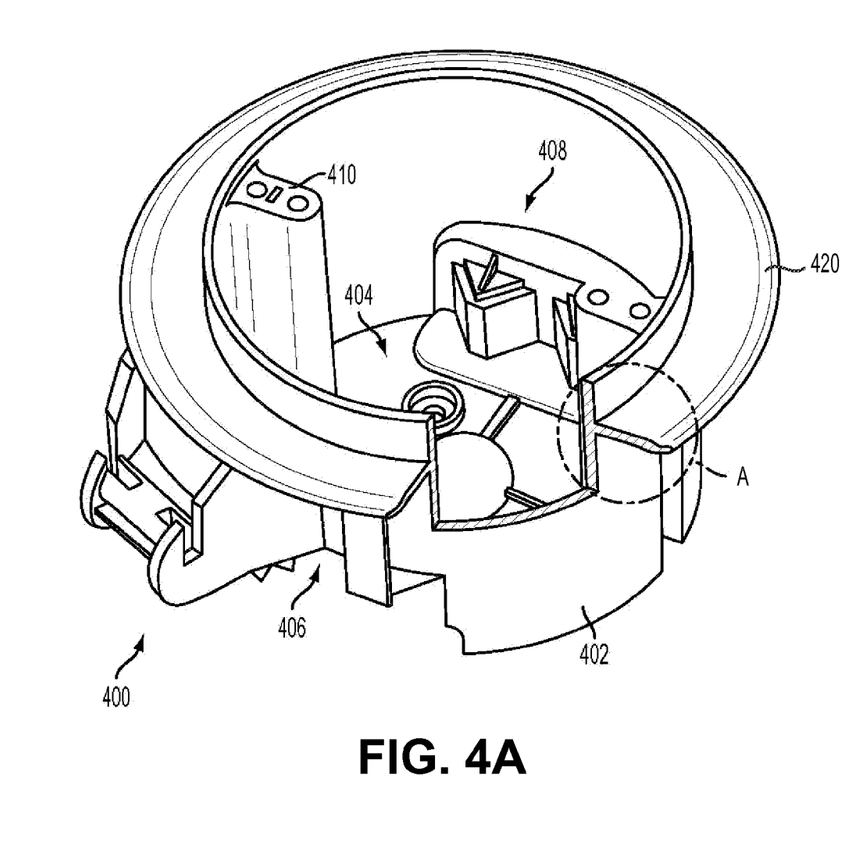
FIG. 4A provides a cutaway view of a round electrical box for new construction according to an implementation described herein.
Figure 4B:
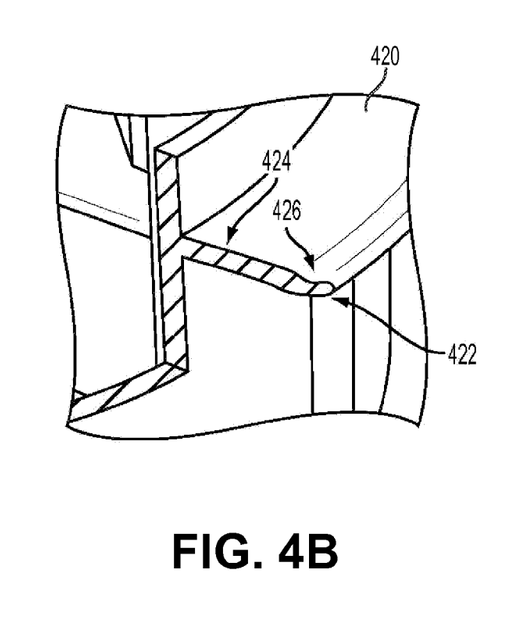
FIG. 4B provides an enlarged view of a portion of FIG. 4A.

FIG. 4A provides a cutaway view of a round electrical box 400, and FIG. 4B provides an enlarged view of a cutaway portion, A, of FIG. 4A. Referring collectively to FIGS. 4A-4B, electrical box 400 may generally include a single wall 402. Wall 402 may join a back plate 404 with one or more openings 406 (e.g., so that cables may be fed into electrical box 100). Wall 402 may form a front opening 408 (e.g., to receive a ceiling fan, lighting fixture, or another electrical device) opposite the back plate. Lugs 410 may be included on wall 402 at front opening 108. Lugs 410 may include threaded openings (or non-threaded openings) configured to align with holes of an electrical device such that a screw, a nail, or some other type of fastener may be used to secure the electrical device to electrical box 400.

Electrical box 400 may be configured to receive an electrical fixture, such as a ceiling fan. Electrical box 400 is generally applicable to new construction (e.g., where electrical box 400 is installed prior to installation of wallboard or another ceiling surface). Electrical box 400 may be made of the same or similar materials to those described above with respect to electrical box 100.

Similar to electrical box 100, electrical box 400 may include a flange 420 configured to engage a rear surface (e.g., of wallboard 10) with a thin outer edge 422. Flange 420 may include a similar cross section to that of flange 120. Particularly, outer edge 422 of flange 420 may extend beyond a primary contact surface 424 of flange 420. Thus, outer edge 422 may contact and slightly press into a rear surface of wallboard 10 when wallboard 10 is forced into place against electrical box 400 during installation. In one implementation, flange 420 may also include a channel 426 that extends around flange 420. Channel 426 may provide an area of reduced cross-section to permit flexing of outer edge 422 independently from the rest of flange 420. In one implementation, flange 420 may include one or more ridges (not shown) next to channel 126, similar to ridges 128 of flange 120. The ridges may provide an increased cross-section to reinforce channel 120 near the area of flexing and may provide an additional contact surface against the rear surface of wallboard 10 when outer edge 422 has fully engaged (e.g., penetrated) the rear surface of wallboard 10.

Figure 5:
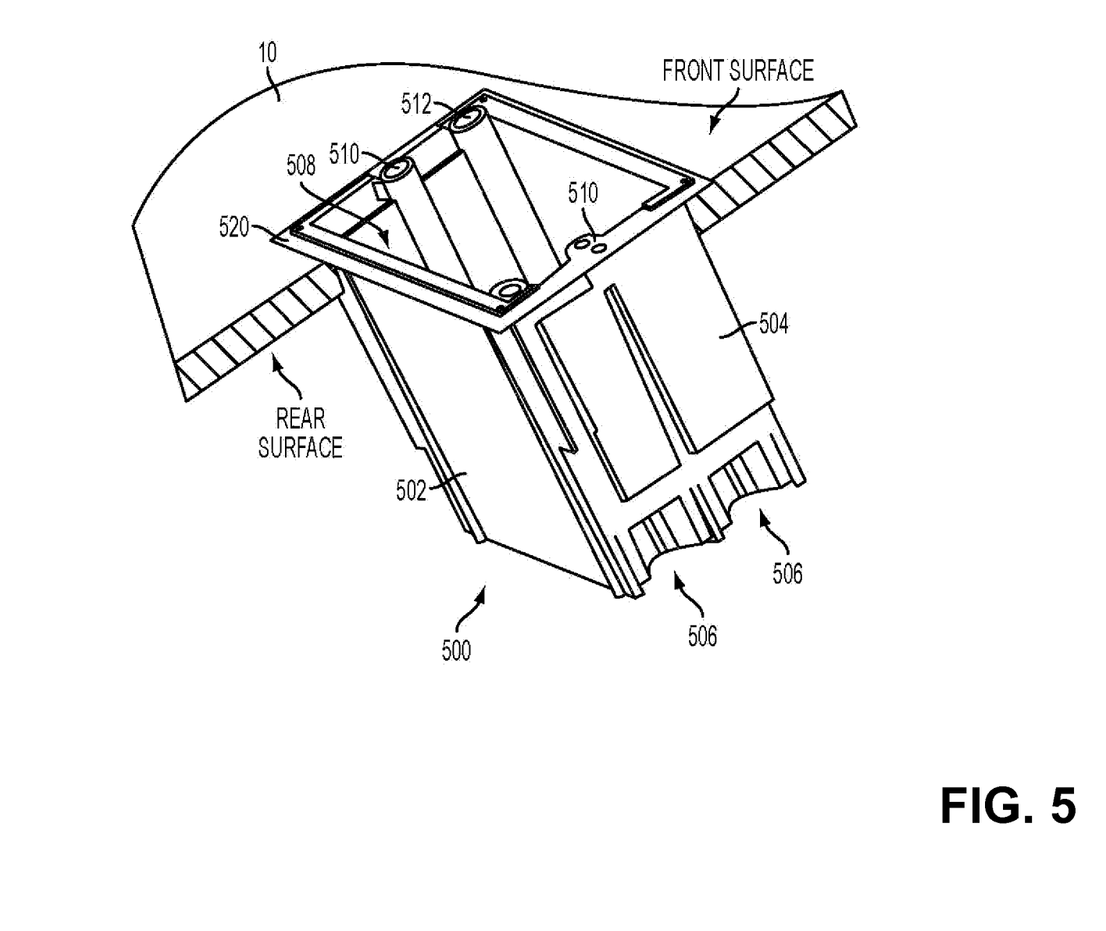
FIG. 5 provides an isometric view of an electrical box for existing construction according to an implementation described herein.

FIG. 5 provides an isometric view of an electrical box 500 for existing construction according to an implementation described herein. Electrical box 500 may generally include multiple walls, such as side walls 502 and end walls 504. Walls 502 and 504 may join a back plate (not visible) with one or more openings 506 (e.g., so that cables may be fed into electrical box 500). Walls 502 and 504 may form a front opening 508 (e.g., to receive a switch, outlet, or another electrical device) opposite the back plate. Lugs 510 may be included on walls 502 and/or 504 at front opening 508. Lugs 510 may include threaded openings (or non-threaded openings) configured to align with holes of an electrical device such that a screw or other type of fastener may be used to secure the electrical device to electrical box 500. As described further herein, electrical box 500 may include a flange 520. In some implementations, as shown in FIG. 5, the cross-section of flange 520 may be modified in the vicinity of lugs 510 to, for example, accommodate mounting surfaces of an installed electrical fixture.

Electrical box 500 shown in FIG. 5 is a "single gang" configuration, where one standard electrical device may be installed within electrical box 500. However, implementations described herein may be applicable to other electrical box sizes (e.g., double gang, triple gang, etc.). Electrical box 500 may also include a configuration to secure electrical box 500 in position in a building. For example, electrical box 500 may include one or more integral mounting apertures 512 to receive a screw or a nail.

Flange 520 may extend laterally from (e.g., essentially perpendicular to) walls 502 and 504 along an outer perimeter of electrical box 500. Flange 520 may be located along the front edges of walls 502 and 504 that form front opening 508. Electrical box 500 may be inserted through an opening in an existing wallboard 10 installation such that a rear surface of flange 520 engages the front surface of wallboard 10. Flange 520 may be configured to engage front surface of wallboard 10 around an opening to prevent insertion of electrical box 500 past the front surface of wallboard 10. The location of flange 520 along the front edges of walls 502 and 504 ensures that front opening 508 of electrical box 500, when installed, may be flush or nearly flush with the front surface of drywall 10.

Electrical box 500 is generally applicable for installation in previously constructed wall surfaces, where electrical box 500 is installed after wallboard 10 is in place. Electrical box 500 may be made using similar materials and/or processes to those described above with respect to electrical box 100.

Figure 6A:
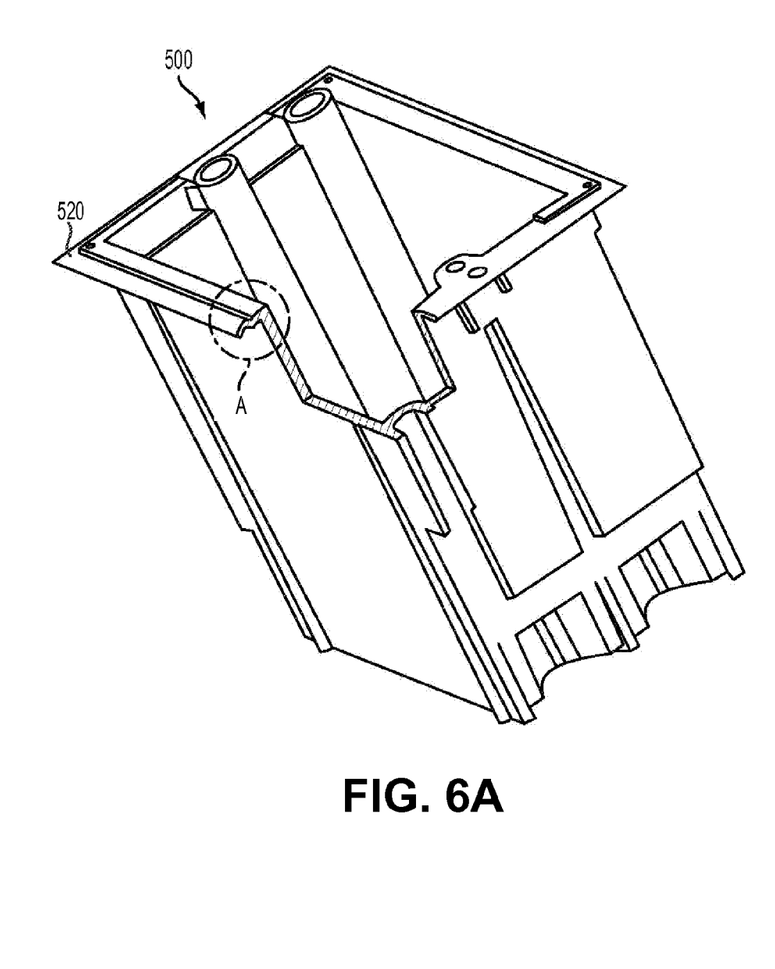
FIG. 6A provides a cutaway view of the electrical box of FIG. 5.
Figure 6B:
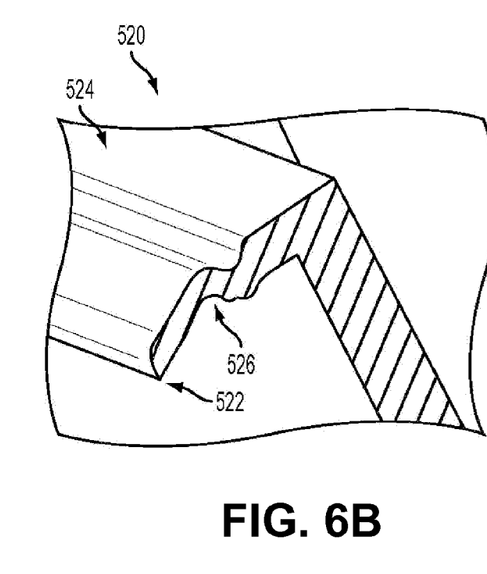
FIG. 6B provides an enlarged view of a portion of FIG. 6A.
Figure 7:
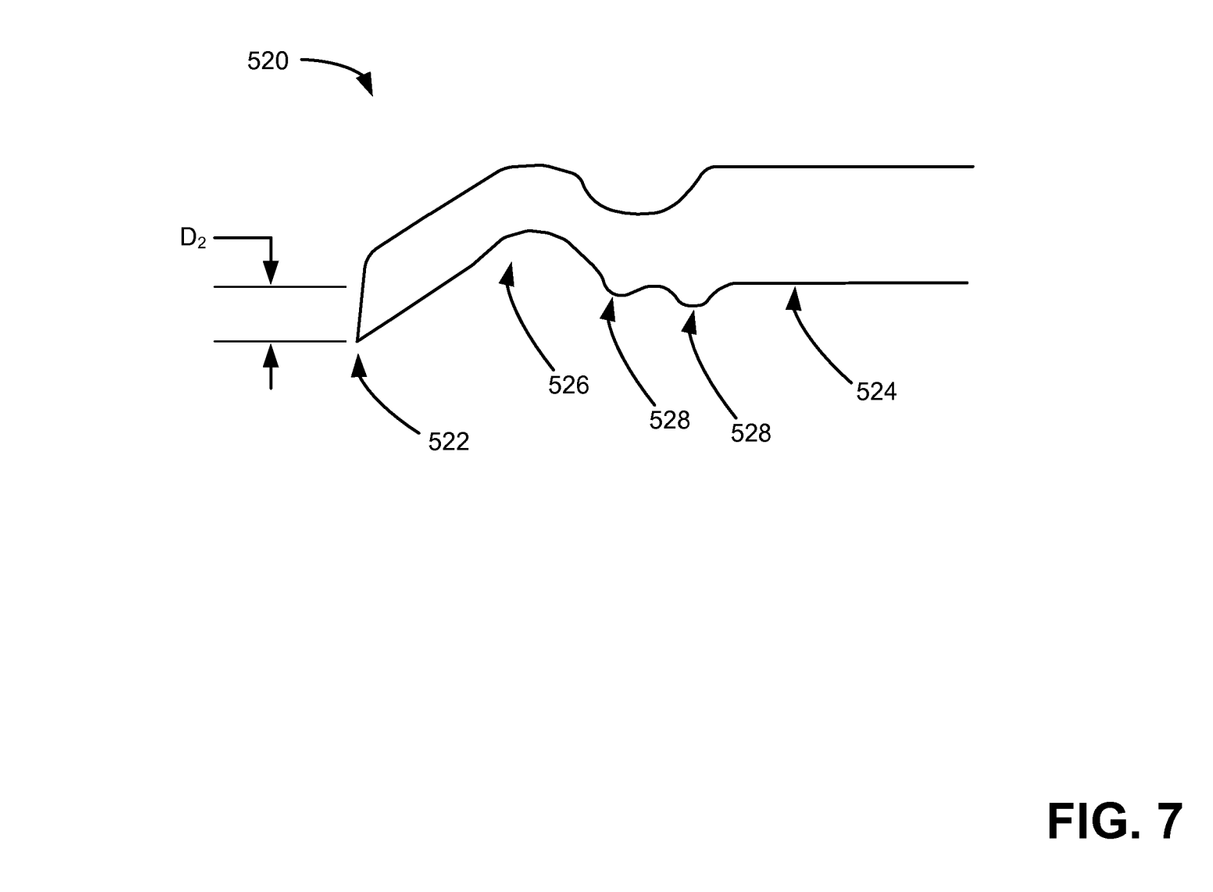
FIG. 7 is cross-section view of a flange of the electrical box of FIG. 5.

FIG. 6A provides a cutaway view of electrical box 500, and FIG. 6B provides an enlarged view of a cutaway portion, A, of FIG. 6A. FIG. 7 is cross-sectional view of flange 520 of electrical box 500. Referring collectively to FIGS. 5-7, flange 520 of electrical box 500 may be configured to engage a front surface (e.g., of wallboard 10) with a thin outer edge 522. Outer edge 522 may extend a distance, $D_2$, beyond a primary contact surface 524 of flange 520. Thus, outer edge 522 may contact and slightly press into a front surface of wallboard 10 when electrical box 500 is pushed into place against wallboard 10 during installation.

Flange 520 may also include a channel 526 that extends around one or more portions of flange 520. Channel 526 may provide an area of reduced cross-section (e.g., relative to the cross-sectional area at primary contact surface 524) to permit flexing of outer edge 522 independently from the rest of flange 520. In one implementation, flange 520 may include one or more ridges 528 next to channel 526. Ridges 528 may provide additional cross-sectional area to reinforce channel 520 near the area of flexing. Ridges 528 may also provide an additional contact surface against the front surface of wallboard 10 when outer edge 522 has fully engaged (e.g., penetrated) the rear surface of wallboard 10.

Figure 8:
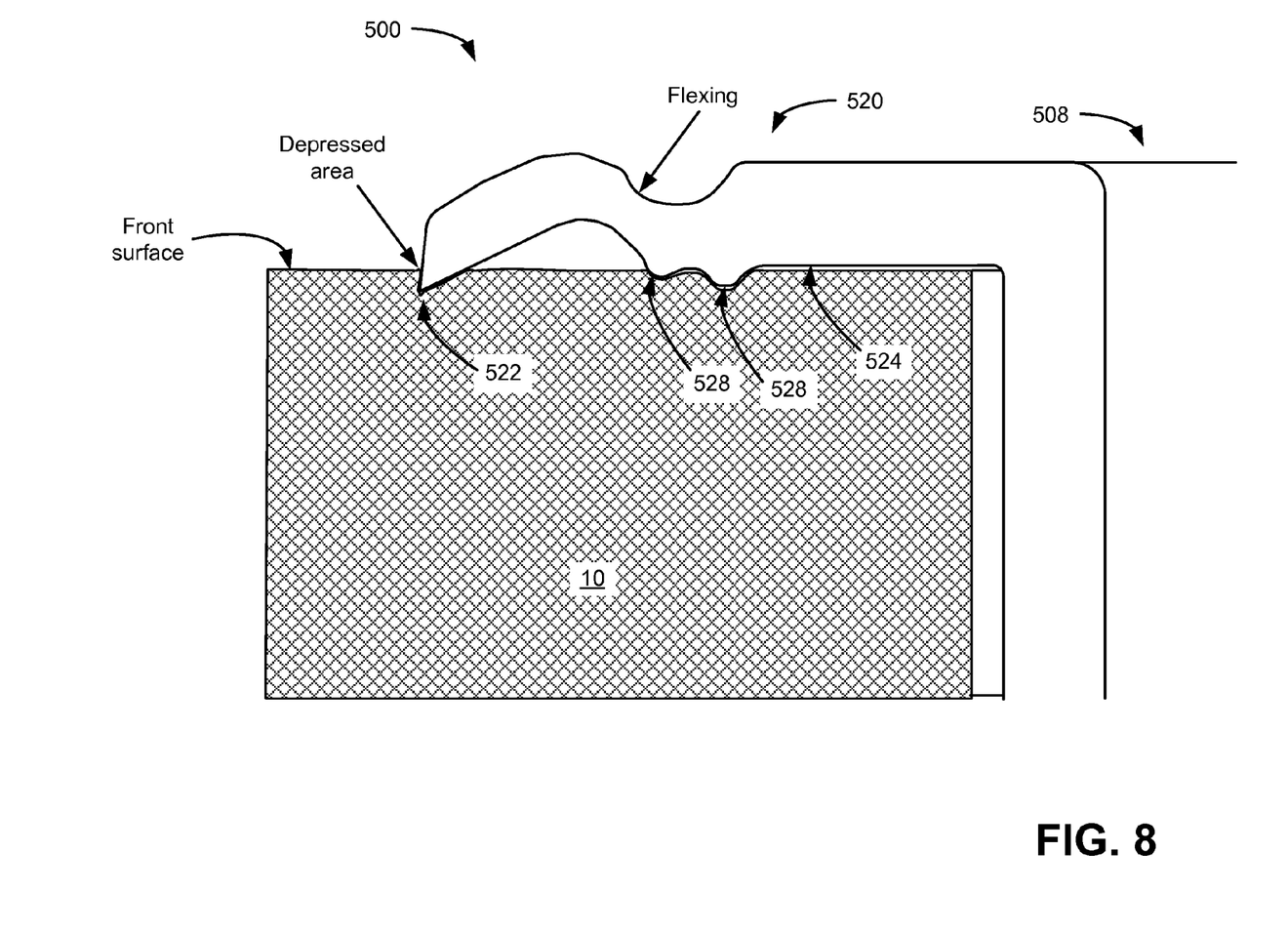
FIG. 8 is a cross-sectional view of the flange of FIG. 7 engaged with a wallboard.

FIG. 8 provides a cross-sectional view of flange 520 engaged with wallboard 10. Referring collectively to FIG. 5-8, electrical box 500 may be secured within an opening of previously installed wallboard 10 using, for example, mounting apertures 512. Flange 520 may be pressed against the front surface of wallboard 10, so that front opening 508 may generally be in the same plane as the front surface of wallboard 10. More particularly, outer edge 522 may push against the front surface of wallboard 10 so that outer edge 522 cuts into the front surface of wallboard 10 as outer edge 522 is forced into place. Outer edge 522 may flex slightly in the reduced cross-section area so that the depth of penetration into the front surface of wallboard 10 may be less than the depth, $D_2$, before electrical box 500 is installed. The penetration of outer edge 522, along all or a substantial portion of the perimeter of flange 520, into the front surface of wallboard 10 may form a vapor-tight seal between electrical box 500 and wallboard 10. The thickness of flange 520, in an installed configuration, may generally be sufficiently thin so as to allow a standard outlet/switch cover plate to be installed over opening 508 and sit flush against the front surface of wallboard 10.

Implementations described herein provide a design for an electrical box that can provide a vapor-tight seal without the use of a separate gasket. According to one implementation, the electrical box may include one or more sides joined to form a front opening to receive an electrical device and a flange extending laterally from the one or more sides. The flange may include a blade edge configured to have an initial engagement with a surface of a wallboard when the electrical box is installed in an opening of the wallboard. When the electrical box is installed in the opening of the wallboard, the blade edge forms a vapor-tight barrier between the electrical box and the surface of the wallboard. Thus, the electrical box may achieve requirements for vapor-tight installation as an integrated piece without the use of a separate foam gasket.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, instead of a single flange, a set of flanges (e.g., each extending laterally from a separate side wall of the electrical box) with blade edges may be used. Furthermore, any particular size (e.g., single-gang, double-gang, etc.) or shape (e.g., rectangular opening, round opening, etc.) may be used with embodiments described herein for either new construction or existing construction.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An electrical box, comprising:
    one or more sides joined to form a front opening to receive an electrical device; and
    a flange extending laterally from the one or more sides, the flange including a blade edge that is integral to the flange and configured to have an initial engagement with a surface of a wallboard when the electrical box is installed in an opening of the wallboard,
    wherein the flange further comprises an area of reduced cross-section between the blade edge and a primary contact surface of the flange to permit flexing of the blade edge independent of the primary contact surface,
    wherein, when the electrical box is installed in the opening of the wallboard, the blade edge forms a vapor-tight barrier between the electrical box and the surface of the wallboard without use of a separate gasket.

2. The electrical box of claim 1, wherein the flange further comprises a channel defining the area of reduced cross-section and a ridge adjacent to the channel.

3. The electrical box of claim 1, wherein the blade edge is configured to press into the surface of the wallboard.

4. The electrical box of claim 1, wherein the flange is located at a distance from a front edge of the one or more sides adjacent the front opening, the distance being configured to accommodate a thickness of the wallboard between the flange and the front edge.

5. The electrical box of claim 1, wherein the flange is located at a front edge of the one or more sides adjacent the front opening.

6. The electrical box of claim 5, wherein the flange is configured to fit under an electrical cover plate.

7. The electrical box of claim 1, wherein the flange is configured to engage the surface of the wallboard around the opening to prevent insertion of the electrical box past the engaged surface.

8. The electrical box of claim 1, wherein the one or more sides are configured to form one of:
    a single gang configuration,
    a multiple-gang configuration, or
    a round configuration.

9. The electrical box of claim 1, wherein the electrical box comprises a single molded piece.

10. The electrical box of claim 1, wherein, when installed, the flange extends substantially parallel to a plane defined by the surface of the wallboard, and wherein the blade edge is configured to extend at an angle into the plane defined by the surface of the wallboard.

11. A flange for an electrical box, comprising:
    a primary contact surface configured to engage a front wallboard surface and prevent insertion of the electrical box past the flange when the electrical box is installed in an opening of the wallboard, wherein the front wallboard surface faces a room's interior; and
    a blade edge configured to contact the front wallboard surface and form a vapor-tight barrier between the electrical box and the front wallboard surface when the electrical box is installed in the opening of the wallboard.

12. The flange of claim 11, wherein the flange is configured to fit between an electrical cover plate and the front wallboard surface.

13. The flange of claim 11, further comprising:
an area of reduced cross-section between the blade edge and the primary contact surface of the flange to permit flexing of the blade edge independent of the primary contact surface.

14. The flange of claim 13, wherein the area of reduced cross-section forms a channel in the flange, and wherein the flange further comprises:
a ridge adjacent to the channel.

15. A flange for an electrical box, comprising:
a primary contact surface configured to engage a rear wallboard surface and align a front opening of the electrical box with a front wallboard surface when the electrical box is installed in an opening of the wallboard; and
a blade edge configured to contact the rear wallboard surface and form a vapor-tight barrier between the electrical box and the rear wallboard surface when the electrical box is installed in the opening of the wallboard, wherein the blade edge is configured to press into the rear wallboard surface.

16. The flange of claim 15, further comprising:
an area of reduced cross-section between the blade edge and the primary contact surface of the flange to permit flexing of the blade edge independent of the primary contact surface.

17. The flange of claim 15, wherein the area of reduced cross-section forms a channel in the flange, and wherein the flange further comprises:
a ridge adjacent to the channel, wherein the ridge is configured to contact the rear wallboard surface before the primary contact surface contacts the wallboard surface.

18. The flange of claim 15, wherein the flange is molded with the electrical box as part of a single piece.

19. The flange of claim 15, wherein the flange extends laterally from a side of the electrical box.

20. The flange of claim 11, wherein the blade edge is configured to press into the front wallboard surface.

\* \* \* \* \*